(12) United States Patent
Gruendler et al.

(10) Patent No.: US 8,492,658 B2
(45) Date of Patent: Jul. 23, 2013

(54) LAMINATE CAPACITOR STACK INSIDE A PRINTED CIRCUIT BOARD FOR ELECTROMAGNETIC COMPATIBILITY CAPACITANCE

(75) Inventors: Nickolaus J. Gruendler, Manor, TX (US); Bhyrav M. Mutnury, Austin, TX (US); Terence Rodrigues, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 429 days.

(21) Appl. No.: 12/947,562

(22) Filed: Nov. 16, 2010

(65) Prior Publication Data

US 2012/0118622 A1    May 17, 2012

(51) Int. Cl.
*H05K 1/11* (2006.01)
*H01K 3/10* (2006.01)

(52) U.S. Cl.
USPC ............. 174/262; 174/260; 361/761; 29/852

(58) Field of Classification Search
USPC ................. 174/260, 262–266; 361/761–764, 361/792–795; 29/852–853
See application file for complete search history.

(56) References Cited

U.S. PATENT DOCUMENTS

| | | | |
|---|---|---|---|
| 4,854,040 A | 8/1989 | Turek | |
| 5,010,641 A | 4/1991 | Sisler | |
| 5,986,893 A | 11/1999 | Leigh et al. | |
| 6,021,050 A | 2/2000 | Ehman et al. | |
| 6,538,538 B2 | 3/2003 | Hreish et al. | |
| 6,728,113 B1 | 4/2004 | Knight et al. | |
| 6,916,719 B1 | 7/2005 | Knight et al. | |
| 7,215,007 B2 | 5/2007 | McKinzie, III et al. | |
| 7,361,847 B2 | 4/2008 | Dunn et al. | |
| 7,409,668 B2 | 8/2008 | Lin et al. | |
| 7,518,884 B2 | 4/2009 | Wright | |
| 7,613,007 B2 | 11/2009 | Amey, Jr. et al. | |
| 7,674,986 B2 | 3/2010 | Chang et al. | |

OTHER PUBLICATIONS

Jun Fan et. al., "Quantifying SMT Decoupling Capacitor Placement in DC Power-Bus Design for Multilayer PCBs", IEEE Transactions on Electromagnetic Compatibility, vol. 43, No. 4, Nov. 2001, pp. 588-599.
Sisler, J., "Eliminating Capacitors From Multilayer PCBs", INSPEC 2010, copyright 1991 IEE, 1 page.

*Primary Examiner* — Jeremy Norris
(74) *Attorney, Agent, or Firm* — Thomas E. Tyson; Jeffrey L. Streets

(57) ABSTRACT

An apparatus comprises a multi-layer printed circuit board having at least three conductor layers, a dielectric material layer between each of the conductor layers, and a laminate capacitor stack arranged transversely through the printed circuit board. The laminate capacitor stack comprises: (a) a plurality of conducting patches including a patch in a plurality of the conductor layers, wherein the plurality of patches are aligned in a stack with the dielectric material filling the space between adjacent patches; (b) a first conducting via interconnecting each patch in a first subset of the plurality of patches, wherein the first subset of the plurality of patches are coupled to one of the conductor layers that is at ground potential; and (c) a second conducting via interconnecting each patch in a second subset of the plurality of patches, wherein the second subset of the plurality of patches are coupled to one of the conductor layers that is at power potential, wherein the patches in the first subset are disposed in an alternating pattern with the patches in the second subset.

17 Claims, 6 Drawing Sheets

LAMINATE CAPACITOR STACK INSIDE A PRINTED CIRCUIT BOARD FOR ELECTROMAGNETIC COMPATIBILITY CAPACITANCE

BACKGROUND OF THE INVENTION

1. Field of the Invention

The present invention relates to multi-layer printed circuit boards, and more specifically to an internal capacitor structure that provides improved electromagnetic compatibility.

2. Background of the Related Art

Multilayer printed circuit boards are widely used in computer systems for providing interconnections between integrated circuit (IC) chips and other components. As is well known, a multilayer printed circuit board typically comprises a board having a plurality of insulated conductive trace layers, including outer and inner conductive signal trace layers and power and ground planes. Components such as integrated circuits (ICs) are typically mounted on the outer board surfaces and electrically connected to trace layers formed on one or both of the outer surfaces. Interconnections between inner and outer trace layers and to power and ground planes are typically provided using plated-through holes or "vias."

One of the problems associated with the use of multilayer printed circuit boards is that, during operation, the high speed switching signals can cause high speed fluctuations in the voltage level between the power and ground planes. As a result, it is typical to place capacitors between the power and ground planes in order to provide voltage stabilization. In fact, these capacitors (referred to as electromagnetic compatibility (EMC) capacitors) may be located across the entire external surface area of a printed circuit board.

However, such capacitors have practical high frequency limits of about 1 GHz or less due to the parasitic series inductance of the traces and vias that are used to electrically connect the capacitor between the power and ground layers. Even the inductance that is inherent in these capacitors will reduce the high frequency limit of operation.

BRIEF SUMMARY OF THE INVENTION

One embodiment of the invention provides an apparatus comprising a multi-layer printed circuit board having at least three conductor layers, a dielectric material layer between each of the conductor layers, and a laminate capacitor stack arranged transversely through the printed circuit board. The laminate capacitor stack comprises: (a) a plurality of conducting patches including a patch in a plurality of the conductor layers, wherein the plurality of patches are aligned in a stack with the dielectric material filling the space between adjacent patches; (b) a first conducting via interconnecting each patch in a first subset of the plurality of patches, wherein the first subset of the plurality of patches are coupled to one of the conductor layers that is at ground potential; and (c) a second conducting via interconnecting each patch in a second subset of the plurality of patches, wherein the second subset of the plurality of patches are coupled to one of the conductor layers that is at power potential, wherein the patches in the first subset are disposed in an alternating pattern with the patches in the second subset.

Another embodiment of the invention provides a method comprising forming a multi-layer printed circuit board having at least three conductor layers and a dielectric material layer between each of the conductor layers; and forming a laminate capacitor stack arranged transversely through the printed circuit board. The laminate capacitor stack that is formed comprises: (a) a plurality of conducting patches including a patch in a plurality of the conductor layers, wherein the plurality of patches are aligned in a stack with the dielectric material filling the space between adjacent patches; (b) a first conducting via interconnecting each patch in a first subset of the plurality of patches, wherein the first subset of the plurality of patches are coupled to one of the conductor layers that is at ground potential; and (c) a second conducting via interconnecting each patch in a second subset of the plurality of patches, wherein the second subset of the plurality of patches are coupled to one of the conductor layers that is at power potential, wherein the patches in the first subset are disposed in an alternating pattern with the patches in the second subset.

DETAILED DESCRIPTION OF THE INVENTION

Figure 1:
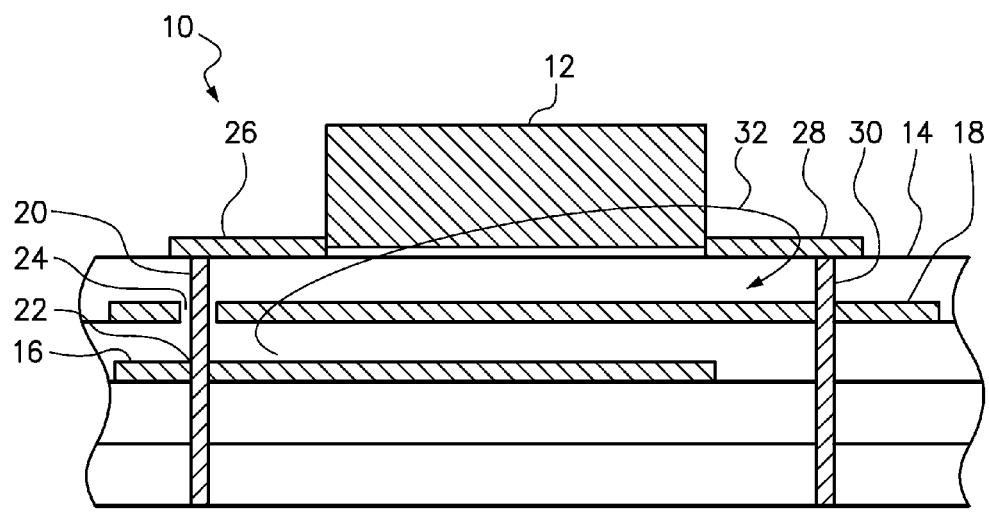
FIG. 1 is a cross-sectional side view of a printed circuit board (PCB) having an electromagnetic compatibility (EMC) capacitor mounted on an external surface.

One embodiment of the invention provides an apparatus comprising a multi-layer printed circuit board having at least three conductor layers, a dielectric material layer between each of the conductor layers, and a laminate capacitor stack arranged transversely through the printed circuit board. The laminate capacitor stack comprises: (a) a plurality of conducting patches including a patch in a plurality of the conductor layers, wherein the plurality of patches are aligned in a stack with the dielectric material filling the space between adjacent patches; (b) a first conducting via interconnecting each patch in a first subset of the plurality of patches, wherein the first subset of the plurality of patches are coupled to one of the conductor layers that is at ground potential; and (c) a second conducting via interconnecting each patch in a second subset of the plurality of patches, wherein the second subset of the plurality of patches are coupled to one of the conductor layers that is at power potential, wherein the patches in the first subset are disposed in an alternating pattern with the patches in the second subset.

The conducting patches serve as capacitor plates or electrodes on opposing sides of the dielectric material that fills the space there between. The patches may have any shape, and may be a region of a larger power plane or ground plane structure. Each patch may be connected to other conducting structure within the same plane, so long as that structure is at the same potential. In one option, a patch of a first laminate capacitor stack may be connected to another nearby patch that is on the same layer but is part of a second laminate capacitor stack, so long as the interconnected patches are at the same net/voltage. If a power or ground layer or plane extends over a substantial majority of the area of the printed circuit board, then the "patches" are that portion of the layer or plane that overlaps with adjacent patches of the laminate capacitor stack with dielectric material there between.

A first conducting via interconnects each patch in a first subset of the plurality of patches, wherein the first subset of the plurality of patches are coupled to one of the conductor layers that is at ground potential. Similarly, a second conducting via interconnects each patch in a second subset of the plurality of patches, wherein the second subset of the plurality of patches are coupled to one of the conductor layers that is at power potential. Accordingly, there is no direct current path between the power planes and the ground planes, such that current from the power plane returns to the ground plane through the capacitors of the internal laminate capacitor stack. The conducting via that interconnects the power patches, however, must pass through or around the ground patches, and will preferably extend through anti-pads in the ground patches to provide electrical isolation. Similarly, a conducting via that interconnects the ground patches will preferably extend through an anti-pad in the power patches to provide electrical isolation. Because the conducting power and ground patches are arranged in an alternating transversely spaced apart pattern within the printed circuit board, the arrangement of a via to interconnect the power patches and a via to interconnect the ground patches may be referred to herein as "stitching."

In a preferred embodiment of the multi-layer printed circuit board, the laminate capacitor stack forms a plurality of capacitors providing parallel current pathways from the interconnected power patches to the interconnected ground patches. These parallel current pathways are internal to the printed circuit board and reduce the total inductance between the power plane and the ground plane. In a further embodiment, the laminate capacitor stack is used instead of an external EMC capacitor. This eliminates a component and its expense from the production of the printed circuit board. Furthermore, the laminate capacitor stack has been shown to be more effective than an external EMC capacitor at reducing noise at frequencies greater than 700 MHz. Preferably, the laminate capacitor stack does not interfere with use of the external surface of the printed circuit board. As a result, signal lines or other components on an external surface of the printed circuit board may extend through a region that is aligned with the internal laminate capacitor stack.

The dielectric material filling the space between the conducting patches may be the same material used to form the printed circuit board substrate between each layer, such as FR4 or MEG6. This provides a significant manufacturing convenience while producing a suitable capacitor stack. However, it is within the scope of the present invention that the dielectric material may be a different material, such as a dielectric material selected to modify or increase the performance of the capacitor.

In yet another embodiment, the multi-layer printed circuit board further comprises a plurality of the laminate capacitor stacks formed in the printed circuit board. The structure of each laminate capacitor stack may be the same or similar, but each additional laminate capacitor stack provides additional capacitance between the power and ground planes. The plurality of laminate capacitor stacks are preferably spaced apart over the area of the printed circuit board.

Another embodiment of the invention provides a method comprising forming a multi-layer printed circuit board having at least three conductor layers and a dielectric material layer between each of the conductor layers; and forming a laminate capacitor stack arranged transversely through the printed circuit board. The laminate capacitor stack that is formed comprises: (a) a plurality of conducting patches including a patch in a plurality of the conductor layers, wherein the plurality of patches are aligned in a stack with the dielectric material filling the space between adjacent patches; (b) a first conducting via interconnecting each patch in a first subset of the plurality of patches, wherein the first subset of the plurality of patches are coupled to one of the conductor layers that is at ground potential; and (c) a second conducting via interconnecting each patch in a second subset of the plurality of patches, wherein the second subset of the plurality of patches are coupled to one of the conductor layers that is at power potential, wherein the patches in the first subset are disposed in an alternating pattern with the patches in the second subset. In one embodiment, the method further comprises forming a plurality of the laminate capacitor stacks within the printed circuit board.

FIG. 1 is a schematic cross-sectional side view of a multi-layer printed circuit board (PCB) 10 having a prior art electromagnetic compatibility (EMC) capacitor 12 mounted on an external surface 14 of the PCB. The EMC capacitor 12 is connected in a current pathway from the power plane 16 to the ground plane 18. In particular, current flows from the power plane 16 to the conducting via 20 which is connected with the power plane 16 at point 22. The conducting via 20 extends through an anti-pad in the ground plane 18 to prevent contact with the ground plane 18. At the surface 14, the conducting via 20 connects to a conducting interconnect 26 that extends into operative contact with a first terminal of the EMC capacitor 12. A second terminal of the EMC capacitor 12 is in operative contact with a conducting interconnect 28 that extends into contact with a second conducting via 30. The second conducting via 30 extends into the PCB and makes contact with the ground plane 18. Accordingly, noise energy may follow the current path (generally traced by the arrow 32) that has just been described. This current path is quite long and includes two different vias (20 and 30) and two different interconnects (26 and 28). These elements of the pathway cause parasitic inductance that reduces the effectiveness of the EMC capacitor 12, especially at higher frequencies.

Figure 2:
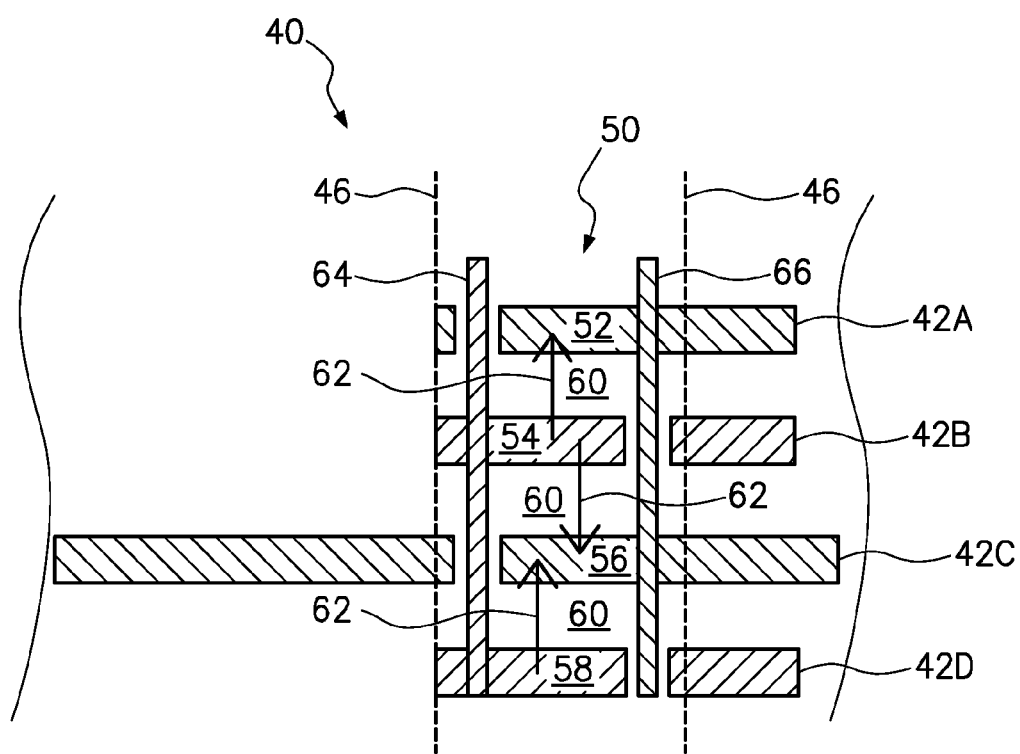
FIG. 2 is a cross-sectional side view of a printed circuit board having a group of EMC capacitors formed within the layers of the PCB.

FIG. 2 is a schematic cross-sectional side view of a printed circuit board 40 having a laminate capacitor stack 50 formed within the layers of the PCB. The PCB 40 has four planes or layers 42A, 42B, 42C, 42D. These planes or layers may include one or more signal layers, one or more power layers and one or more ground layers. The signal traces or elements within the PCB 40 should be kept out of the area of the laminate capacitor stack 50. Accordingly, a "keep-out area" is an area of the PCB that should not have any signal traces in an internal signal layer that would extend between adjacent power and ground patches.

As shown, the layer 42C is a ground layer that extends leftward and rightward of a ground patch 56 that is part of the laminate capacitor stack 50. Accordingly, the ground layer may extend over substantially the entire area of the PCB. Still, that portion of the ground layer 42C that lies in the keep-out area between the two dashed lines 46 is referred to as a "patch." Nevertheless, each layer should have a conducting patch in the keep-out area between the two dashed lines 46. As shown, the PCB 40 includes a first conducting ground patch 52 (part of plane 42A), a first conducting power patch 54 (part of plane 42B), a second conducting ground patch 56 (part of plane 42C), and a second conducting power patch 58 (part of plane 42D).

A dielectric material 60 is shown between each adjacent pairing of the power and ground patches to form the laminate capacitor stack 50 with three internal capacitors. Namely, a first capacitor is formed between the top two conducting patches 52, 54, a second capacitor is formed between middle two conducting patches 54, 56, and a third capacitor is formed between lower two conducting patches 56, 58. While the dielectric material 60 is illustrated as being narrower than the keep out area between the two dashed lines 46, the dielectric material would typically extend at least to the edges of the keep out area. Where the dielectric material is the same PCB substrate used throughout the PCB, then all of the space between layers would be filled with the dielectric material. With respect to any individual one of the three capacitors in the stack 50, current will flow from the conducting power patch to the conducting ground patch. The direction of current flow is represented by arrows 62.

To complete the laminate capacitor stack 50, a first via 64 is formed to interconnect the two power patches 54, 58, and a second via 66 is formed to interconnect the two ground patches 52, 56. Anti-pads may be used where the first via 64 passes through the ground patches 52, 56 to avoid contact with other elements in the plane, and wherein the second via 66 passes through the power patches 54, 58 to avoid contact with other elements in the plane. It should be recognized that the laminate capacitor stack 50 could be extended in PCBs having additional layers.

Figure 3:
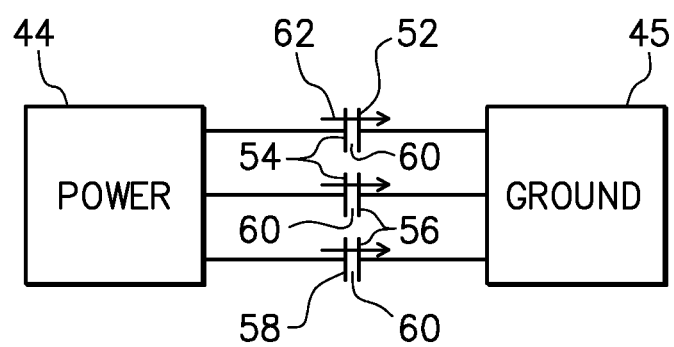
FIG. 3 is circuit diagram illustrating that the internal capacitors of FIG. 2 provide parallel current pathways between the power and ground planes.

FIG. 3 is circuit diagram illustrating that the internal capacitors of FIG. 2 provide parallel current pathways between the conducting power patches (collectively 44) and the conducting ground patches (collectively 45). Schematic elements in the circuit diagram are labeled with a reference number corresponding to the reference number of the actual element in FIG. 2. While the actual capacitance of each internal capacitor is small, these internal capacitors are in parallel, such that the capacitance is additive.

Figure 4:
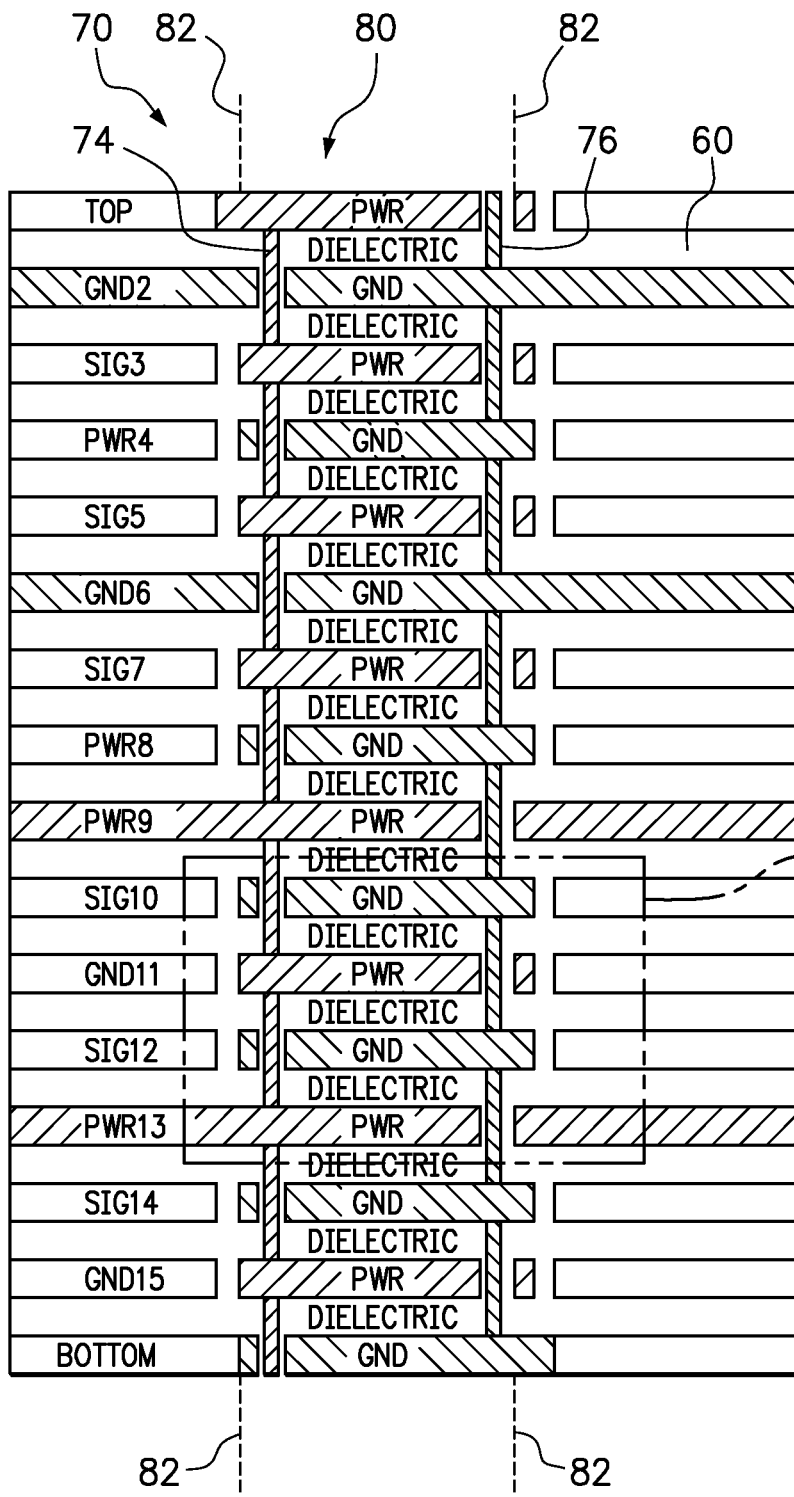
FIG. 4 is a cross-sectional side view of a 16-layer printed circuit board having EMC capacitors formed within the layers of the PCB.

FIG. 4 is a cross-sectional side view of a 16-layer printed circuit board 70 having EMC capacitors formed within the layers of the PCB. The 16-layers refers to the conducting layers, but there are also layers of dielectric material (labeled DIELECTRIC) disposed between each of the conducting layers. On the left, each conducting layer is labeled (from top to bottom) to indicate the function of the layer and the ordinal number of the layer. Namely, the conducting layers are TOP, GND 2, SIG3, PWR4, SIG5, GND6, SIG7, PWR8, PWR9, SIG10, GND11, SIG12, PWR 13, SIG 14, GND15, and BOTTOM. Although these are the functions of the 16 layers, signal traces from the signal (SIG) layers are kept out of the area of the laminate capacitor stack 80 (delineated by the dashed lines 82). Accordingly, a signal layer may contain a power patch or a ground patch depending upon the position within the PCB. The laminate capacitor stack 80 contains eight (8) GND patches and eight (8) PWR patches.

Specifically, the laminate capacitor stack 80 forms 15 capacitors, where one capacitor is formed between each pair of adjacent power and ground patches. Each of the power patches (labeled "PWR") is interconnected by a conducting via 74 in the same manner as described in relation to FIG. 2. Similarly, each of the ground patches (labeled "GND") is interconnected by a conducting via 76 in the same manner as described in relation to FIG. 2. It should be noted that a conducting GND patch will occasionally be disposed in a GND layer (see GND2 and GND6), and a conducting PWR patch will occasionally be disposed in a PWR layer (see PWR9 and PWR13). When the patch is to be at the same electrical potential as the layer in which the layer resides, then the patch may be interconnected with the layer, as shown. Accordingly, the 15 capacitors are connected in parallel between the power and ground layers.

Figure 5:
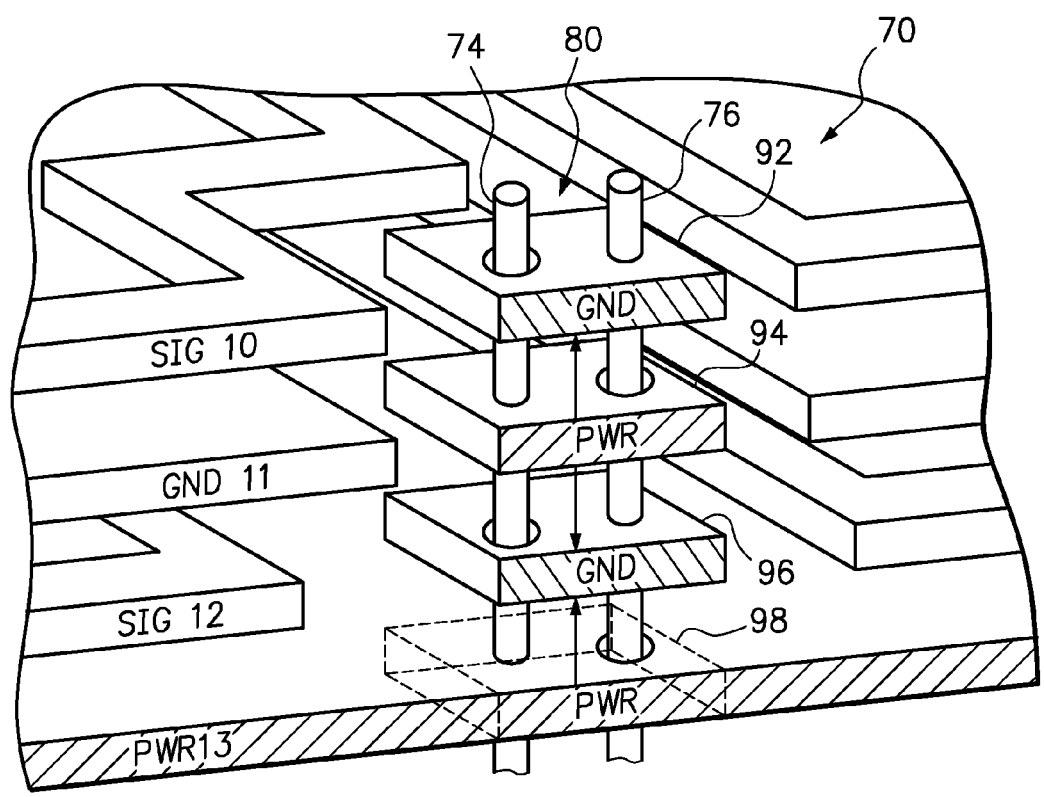
FIG. 5 is a partial perspective view of printed circuit board of FIG. 4, showing the interconnection of two ground patches and the interconnection of two power patches to form three internal EMC capacitors.

FIG. 5 is a partial perspective view of a small section of the printed circuit board 70 of FIG. 4, showing the interconnection of two ground patches 92, 96 and the interconnection of two power planes 94, 98 to form a portion of the laminate capacitor stack 80 with three complete internal EMC capacitors. Note that in order to better show the relationship of the patches, vias and other conductive elements of the PCB, the dielectric material (element 60 in FIGS. 2 and 4) has been omitted (or shown as being transparent). It should be recognized that this is done only for the purpose of illustration.

The conducting patches 92, 94, 96, 98 are delineated by a combination of solid lines where the conducting patch actually terminates and dashed lines where the conducting plane extends into the keep out area. The conducting patches are shown stacked one above the other and in alignment, such that the laminate capacitor stack 50 extend transversely within the PCB 70. In one embodiment, the conducting patches have between 1 and 3 square centimeters of area in the plane.

In this perspective view, the patch 98 (delineated by dashed lines) in layer PWR13 is formed as a portion of a substantially continuous layer. The conducting via 74 interconnects the two power patches 94, 98, but extends through the ground patches 92, 96 with an anti-pad separating the via 74 from the ground patches. Similarly, the conducting via 76 interconnects the two ground patches 92, 96, but extends through the power patches 94, 98 with an anti-pad separating the via 76 from surrounding conducting power patches. It should also be noted the signal traces in the SIG10 and SIG 12 layers are kept out of the area where the laminate capacitor stack 80 extends through the PCB.

Figure 6:
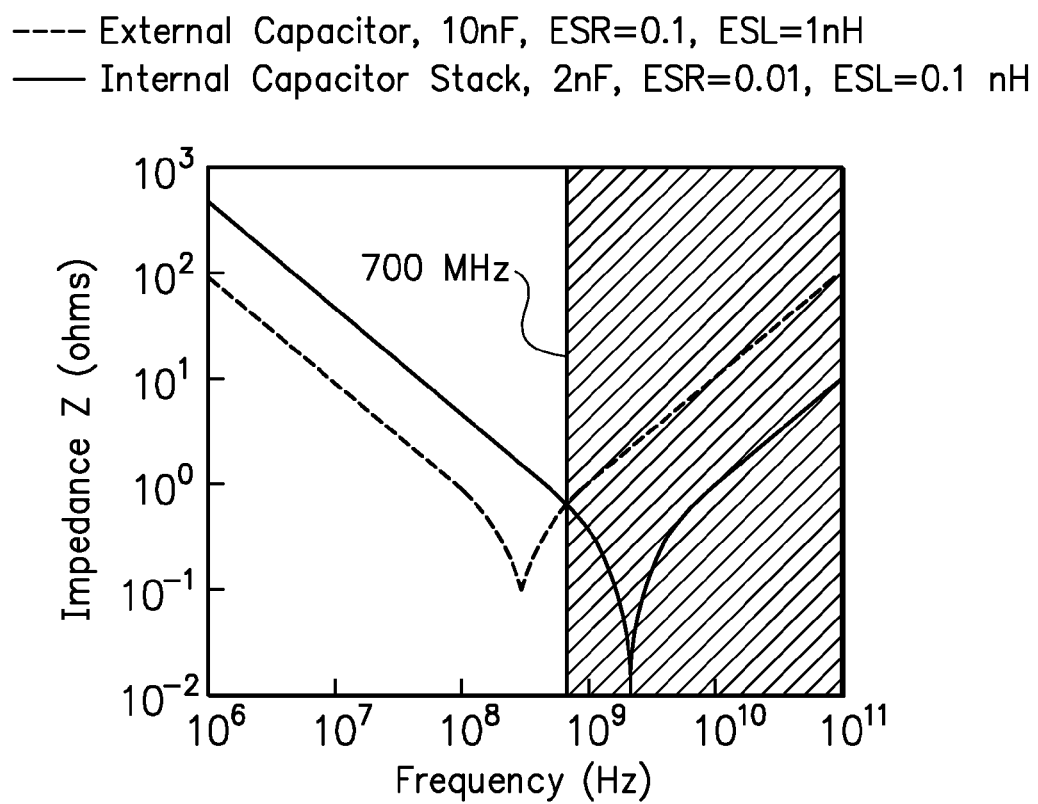
FIG. 6 is a graph of impedance as a function of frequency for both an external capacitor and the internal capacitors of the present invention.

FIG. 6 is a graph of impedance as a function of frequency for both an external capacitor (dashed line) and the internal capacitor stack of the present invention (solid line). This graph was prepared by running a computer simulation of the 16 layer printed circuit board of FIG. 4. The external capacitor had a 10 nanoFarad (nF) capacitance, effective series resistance of 0.1 Ohms and an effective series inductance of 1 nanoHenry (nH). The structure of the laminate capacitor stack was found to increase the effective capacitance and lower the loop inductance. Accordingly, using conducting patches of less than 2 cm across, the laminate capacitor stack provided 2 nF capacitance. However, the 2 nF internal laminate capacitor stack outperforms a 10 nF externally mounted decoupling capacitor in providing a return current path above about 700 MHz (i.e., the frequency at which the two lines cross).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus, comprising:
   a multi-layer printed circuit board having at least three conductor layers and a dielectric material layer between each of the conductor layers;
   a laminate capacitor stack arranged transversely through the printed circuit board, where the laminate capacitor stack comprises:
   (a) a plurality of conducting patches including a patch in a plurality of the conductor layers, wherein the plurality of patches are aligned in a stack with the dielectric material filling the space between adjacent patches;
   (b) a first conducting via interconnecting each patch in a first subset of the plurality of patches, wherein the first subset of the plurality of patches are coupled to one of the conductor layers that is at ground potential; and
   (c) a second conducting via interconnecting each patch in a second subset of the plurality of patches, wherein the second subset of the plurality of patches are coupled to one of the conductor layers that is at power potential, wherein the patches in the first subset are disposed in an alternating pattern with the patches in the second subset.

2. The apparatus of claim 1, wherein the laminate capacitor stack forms a plurality of capacitors providing parallel current pathways from the conducting power layer to the conducting ground layer.

3. The apparatus of claim 2, wherein the parallel current pathways are internal to the printed circuit board.

4. The apparatus of claim 2, wherein the parallel current pathways are directed through the dielectric material.

5. The apparatus of claim 2, wherein the parallel current pathways reduce the total inductance between the conducting power layer and the conducting ground layer.

6. The apparatus of claim 2, wherein the laminate capacitor stack is used instead of an external EMC capacitor.

7. The apparatus of claim 2, wherein the laminate capacitor stack does not interfere with use of the external surface of the printed circuit board.

8. The apparatus of claim 2, further comprising:
   an electronic element disposed on an external surface of the printed circuit board that extends through a region of the printed circuit board that is aligned with the laminate capacitor stack.

9. The apparatus of claim 1, further comprising:
   a plurality of the laminate capacitor stacks formed in the printed circuit board.

10. The apparatus of claim 9, wherein the plurality of laminate capacitor stacks are spaced apart over the area of the printed circuit board.

11. The apparatus of claim 1, wherein the conducting ground layer forms a conducting layer over at least 90% of the area of the printed circuit board.

12. The apparatus of claim 1, wherein the conducting power layer forms a conducting layer over at least 90% of the area of the printed circuit board.

13. The apparatus of claim 1, wherein dielectric material filling the space between the conducting patches is the same material forming the printed circuit board substrate.

14. The apparatus of claim 1, wherein laminate capacitor stack is effective at reducing noise at frequencies greater than 700 MHz.

15. The apparatus of claim 1, wherein the plurality of capacitors provide between 1 and 3 nanoFarads of capacitance.

16. A method, comprising:
   forming a multi-layer printed circuit board having at least three conductor layers and a dielectric material layer between each of the conductor layers; and
   forming a laminate capacitor stack arranged transversely through the printed circuit board, where the laminate capacitor stack comprises:
   (a) a plurality of conducting patches including a patch in a plurality of the conductor layers, wherein the plurality of patches are aligned in a stack with the dielectric material filling the space between adjacent patches;
   (b) a first conducting via interconnecting each patch in a first subset of the plurality of patches, wherein the first subset of the plurality of patches are coupled to one of the conductor layers that is at ground potential; and
   (c) a second conducting via interconnecting each patch in a second subset of the plurality of patches, wherein the second subset of the plurality of patches are coupled to one of the conductor layers that is at power potential, wherein the patches in the first subset are disposed in an alternating pattern with the patches in the second subset.

17. The method of claim 16, further comprising:
   forming a plurality of the laminate capacitor stacks within the printed circuit board.

* * * * *